United States Patent
Patel (10) Patent No.: US 12,287,683 B2
(45) Date of Patent: Apr. 29, 2025

(54) THERMAL MANAGEMENT FOR CONTAINER-BASED DATA CENTERS

(71) Applicant: Core Scientific, Inc., Bellevue, WA (US)

(72) Inventor: Harsh Patel, Stone Mountain, GA (US)

(73) Assignee: Core Scientific, Inc., Austin, TX (US)

( * ) Notice: Subject to any disclaimer, the term of this patent is extended or adjusted under 35 U.S.C. 154(b) by 1167 days.

(21) Appl. No.: 17/095,335

(22) Filed: Nov. 11, 2020

(65) Prior Publication Data

US 2022/0137684 A1 May 5, 2022

Related U.S. Application Data (60) Provisional application No. 63/108,663, filed on Nov. 2, 2020, provisional application No. 63/108,651, filed on Nov. 2, 2020, provisional application No. 63/108,652, filed on Nov. 2, 2020.

(51) Int. Cl.
*G06F 1/20* (2006.01)
*H05K 7/20* (2006.01)

(52) U.S. Cl.
CPC ............ *G06F 1/20* (2013.01); *H05K 7/20136* (2013.01); *H05K 7/20209* (2013.01); *H05K 7/207* (2013.01)

(58) Field of Classification Search
None
See application file for complete search history.

(56) References Cited

U.S. PATENT DOCUMENTS

| | | | |
|---|---|---|---|
| 3,363,534 A | 1/1968 | Spradling | |
| 3,614,922 A | 10/1971 | Sobin | |
| 4,872,504 A | 10/1989 | Huebner | |
| 6,135,875 A | 10/2000 | French | |
| 6,483,699 B1 | 11/2002 | Salmonson et al. | |
| 7,278,273 B1 * | 10/2007 | Whitted | H01R 43/26 62/414 |

(Continued)

FOREIGN PATENT DOCUMENTS

| WO | 02104090 A1 | 12/2002 |
|---|---|---|
| WO | 2013039645 | 3/2013 |

OTHER PUBLICATIONS

Nelson, Dean, et al. "The role of modularity in datacenter design." Sun BluePrints Online, http://www. sun. com/storagetek/docs/ EED. pdf (2009). (Year: 2009).*

(Continued)

*Primary Examiner* — Carlos R Ortiz Rodriguez
(74) *Attorney, Agent, or Firm* — Fishman Stewart PLLC (57) ABSTRACT

Systems and methods for managing airflow for cooling computing devices (e.g. in a data center) in normal and cold environments are disclosed. In one embodiment, the method comprises positioning the computing devices on a plurality of racks with air barriers to create hot and cold aisles. The computing devices may be configured in a first mode to draw in cool air the cold aisles and exhaust heated air into the hot aisles. Temperatures in the cold aisles may be periodically measured. In response to temperatures below a predetermined threshold, one or more of the cold aisles may be converted into a temporary hot aisle by adjusting ventilation openings and configuring a subset of the computing devices to temporarily draw in warm air from the temporary hot aisle.

20 Claims, 7 Drawing Sheets

(56) References Cited

U.S. PATENT DOCUMENTS

| | | | |
|---|---|---|---|
| 7,551,971 B2 * | 6/2009 | Hillis | H05K 7/20745 267/140.11 |
| 8,046,896 B2 * | 11/2011 | Schmitt | H05K 7/20745 165/104.34 |
| 8,047,904 B2 * | 11/2011 | Yates | B65D 88/745 454/118 |
| 8,223,495 B1 | 7/2012 | Carlson et al. | |
| 8,659,895 B1 | 2/2014 | Carlson et al. | |
| 8,857,204 B2 | 10/2014 | Reytblat | |
| 8,914,155 B1 | 12/2014 | Shah et al. | |
| 8,943,757 B2 | 2/2015 | Parizeau et al. | |
| 9,313,929 B1 | 4/2016 | Malone et al. | |
| 9,476,657 B1 | 10/2016 | Pettis et al. | |
| 9,554,491 B1 | 1/2017 | Wong et al. | |
| 9,629,285 B1 | 4/2017 | Lachapelle et al. | |
| 9,674,988 B2 | 6/2017 | Dernis et al. | |
| 9,677,777 B2 | 6/2017 | Karamanos et al. | |
| 9,820,411 B2 | 11/2017 | Alshinnawi et al. | |
| 10,942,195 B1 | 3/2021 | Kom et al. | |
| 10,959,349 B1 | 3/2021 | Patel | |
| 2008/0055848 A1 | 3/2008 | Hamburgen et al. | |
| 2009/0310300 A1 | 12/2009 | Chrysler | |
| 2010/0188810 A1 | 7/2010 | Andersen et al. | |
| 2011/0128699 A1 | 6/2011 | Heydari et al. | |
| 2011/0138708 A1 | 6/2011 | Chazelle et al. | |
| 2011/0240497 A1 * | 10/2011 | Dechene | E04H 5/02 206/320 |
| 2012/0024502 A1 | 2/2012 | Khalifa et al. | |
| 2012/0142265 A1 | 6/2012 | Wei | |
| 2012/0197828 A1 | 8/2012 | Yi | |
| 2012/0258654 A1 | 10/2012 | Peng et al. | |
| 2013/0062047 A1 | 3/2013 | Vaney et al. | |
| 2013/0244563 A1 | 9/2013 | Noteboom et al. | |
| 2014/0069127 A1 | 3/2014 | Bailey et al. | |
| 2014/0133092 A1 | 5/2014 | Leckelt et al. | |
| 2015/0099449 A1 | 4/2015 | Chen et al. | |
| 2015/0241888 A1 | 8/2015 | Kodama | |
| 2015/0327408 A1 | 11/2015 | Ruiz et al. | |
| 2016/0021782 A1 | 1/2016 | Kurosaki et al. | |
| 2016/0081232 A1 | 3/2016 | Zhu | |
| 2016/0128226 A1 | 5/2016 | Stellick et al. | |
| 2016/0192542 A1 | 6/2016 | LeFebvre et al. | |
| 2016/0249484 A1 | 8/2016 | Parizeau et al. | |
| 2017/0042067 A1 | 2/2017 | Parizeau et al. | |
| 2017/0176029 A1 | 6/2017 | Wilding et al. | |
| 2017/0196125 A1 | 7/2017 | Crosby, Jr. et al. | |
| 2017/0269648 A1 | 9/2017 | Ruiz et al. | |
| 2018/0077822 A1 | 3/2018 | Sloan et al. | |

OTHER PUBLICATIONS

Endo, Hiroshi, et al. "Effect of climatic conditions on energy consumption in direct fresh-air container data centers." Sustainable Computing: Informatics and Systems 6 (2015): 17-25. (Year: 2015).*
U.S. Office Action dated Mar. 28, 2022 for U.S. Appl. No. 17/095,310.
Co-pending U.S. Appl. No. 17/095,310, filed Nov. 11, 2020.
Co-pending U.S. Appl. No. 17/095,329, filed Nov. 11, 2020.
Co-pending U.S. Appl. No. 17/150,340, filed Jan. 15, 2021.
Cindy Kiddy: "Psd1212ptb1 SUNON", Taiwan (ROC), Dec. 31, 2010, pp. 1-14, XP055657800, retrieved Jan. 14, 2020.
ISR dated Jan. 23, 2020 for Int'l Appl PCT/US2019/044673.
PCT Partial ISR dated Nov. 11, 2019 for Int'l Appl PCT/US2019/044673.

* cited by examiner

THERMAL MANAGEMENT FOR CONTAINER-BASED DATA CENTERS

CROSS-REFERENCE TO RELATED APPLICATIONS

This application claims the benefit of U.S. Provisional Patent Application Ser. No. 63/108,663, filed on Nov. 2, 2020, titled "THERMAL MANAGEMENT FOR CONTAINER-BASED DATA CENTERS", the contents of which are hereby incorporated by reference in their entirety.

This application claims the benefit of U.S. Provisional Patent Application Ser. No. 63/108,652, filed on Nov. 2, 2020, titled "DYNAMIC AISLES FOR COMPUTING DEVICES", the contents of which are hereby incorporated by reference in their entirety.

This application claims the benefit of U.S. Provisional Patent Application Ser. No. 63/108,651, filed on Nov. 2, 2020, titled "MANAGING AIRFLOW FOR COMPUTING DEVICES", the contents of which are hereby incorporated by reference in their entirety.

TECHNICAL FIELD

The present disclosure generally relates to the field of computing and, more particularly, to systems and methods for managing airflow for groups of computing devices in containers, such as in a container-based data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For these reasons, new data center architectures have been designed to dramatically improve airflow so that ambient air can be used for cooling most if not all of the year based on the location of the data center. One type of data center architecture that is increasingly popular is a container-based data center. In container-based architectures, computing devices are housed on racks inside containers (e.g., shipping containers). Depending on the configuration, these containers can provide the improved airflow described above. In addition, these container-based data centers have several other advantages over traditional data centers, including lower cost, easier mobility, and the potential for lower environmental impact.

One drawback to these improved airflow designs, and container-based designs in particular, occurs during winter when the ambient air temperature drops so low that the computing devices begin to perform poorly as they are below their minimum designed operating temperature. Some data centers may use heat pumps or furnaces to preheat the air incoming to the data center or mixing chambers with recirculating fans, ductwork and valves that mix the exhaust heat from the computing devices with the incoming air to raise the temperature. However, heating the air with heat pumps or furnaces is not energy efficient, using mixing chambers with recirculating ductwork can negatively impact airflow, and using additional fans consumes additional energy and can further reduce system efficiency.

For at least these reasons, there is a desire for a solution that efficiently cools computing devices in containers and efficiently maintains temperatures above undesirable levels when ambient temperatures are low.

SUMMARY

A system and method for managing airflow for a plurality of computing devices (e.g., in a container-based data center) are contemplated. In one embodiment, the method comprises positioning the computing devices on racks within containers that each have an intake side vent and an exhaust side vent. Each of computing devices have an associated cooling fan configured to generate airflow through the computing device and exhaust hot air out the exhaust side vent. The containers may be configured into two modes. In the first mode, cool air is drawn in from the intake side vent and hot air is exhausted from the exhaust side vent. Temperature data such as ambient temperatures and or weather forecast data is read, and in response to the temperature data being below a predetermined threshold, one or more of the containers may be selected and temporarily reconfigured in a second mode to draw in hot air exhausted via the container's intake side vent. When ambient temperatures are too low for efficient operation of the computing devices, switching modes to draw in hot air may improve the efficiency of the computing devices.

In some embodiments, the temporary reconfiguring may be accomplished by connecting the first selected container's intake side vent to the second selected container's exhaust side vent and or temporarily moving the first selected container adjacent to a second container so that the first selected container's intake side vent is adjacent to the second container's exhaust side vent. Adjacent in this context includes, for example, being near enough to draw in enough hot air from the exhaust side vent to raise the temperature of the air cooling the computing devices above a predetermined minimum desired operating temperature.

In some embodiments, in response to the temperature data being below a predetermined threshold, a third container may be temporarily reconfigured to draw hot air that is exhausted by the first selected container into the third selected container's intake side vent. This creates a three-container chain of adjacent containers. As with the first two containers, the third container may be reconfigured by connecting the third container's intake side vent to the first selected container's exhaust side vent and or temporarily moving the third container adjacent to the first selected containers so that the third container's intake side vent is adjacent to the first selected container's exhaust side vent. In some embodiments, one or more of the containers may be placed on wheels or other sliding mechanisms to permit easier movement.

In some embodiments, the speed of the cooling fans in a container may be increased in response to being in the first mode and decreased in response to being reconfigured in the second mode. As the air may have a higher pressure from being exhausted, the computing devices in the receiving container may not need to spin as fast to ensure proper airflow when in the second (low ambient temperature) mode.

In some embodiments, the method may be implemented as a computer program having instructions executable by a processor of a computational device and stored on a non-transitory, computer-readable storage medium (e.g., disk or flash memory). When executed, the instructions may cause the computational device to configure a set of movable containers in one of two modes. As described above, each container may have an intake side vent, an exhaust side vent, and shelves for supporting computing devices with cooling fans. In the first mode, the computing devices' fans generate an airflow through the computing device where cool air is drawn into each of the containers from the intake side vents and hot air is exhausted from a second side. Temperature data (e.g., weather forecast data and ambient temperature data) is read. In response to the temperature data being below a predetermined threshold, one or more of the containers are temporarily reconfigured into a second mode where they draw in (via their intake side vents) hot air exhausted out the exhaust side vents of other containers. In some embodiments, in response to the temperature data being below a predetermined threshold, a third container may be selected and configured to draw in hot air exhausted by the second container (e.g., creating a cool-hot-hot chain of containers).

A system for managing temperatures in a container-based data center is also contemplated. In one embodiment, the system may comprise a set of containers, each having an intake side vent and an exhaust side vent, and a set of racks, each positioned inside one of the containers. The racks are configured to hold computing devices with cooling fans that are configured to generate an airflow through the computing device and exhaust hot air out the container's exhaust side vent. The system may also have a controller that configures each of the containers into one of two different modes. In the first mode, cool air is drawn into the container from the intake side vents and hot air is exhausted from a second side. The controller may be configured to read temperature data such as ambient temperature read from a temperature sensor and or weather forecast data (e.g., from a network-based forecast service).

In response to the temperature data being below a predetermined threshold, the controller may temporarily reconfigure at least one container into a second mode to draw in hot air exhausted by computing devices rather than just drawing in cool air.

In some embodiments, this is accomplished by moving the computing devices in the first selected container away from the exhaust side vent of the first selected container to permit at least a portion of the hot air expelled by the computing devices to recirculate within the container.

In other embodiments, the second mode is configured by drawing the hot air into the container from the exhaust of another nearby container. This may be accomplished by positioning the first container's intake vent near the second container's exhaust vent (e.g., by temporarily moving the containers closer to each other so that one container's intake side vent is adjacent to another container's exhaust side vent). In other embodiments where moving containers is not desired, it may be accomplished using direct connection between the two containers (e.g., with one or more adjustable air deflectors or valves that can direct exhaust air from one container into the other container, or direct exhaust air away and direct ambient cool air to the intake vent).

In some embodiments, the controller may be configured to temporarily reconfigure a third container to draw in hot air exhausted via its intake side vent from a second container that is already drawing in hot air exhausted by a first container, effectively creating a three container chain. Additional longer chains are also possible and contemplated.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1A:
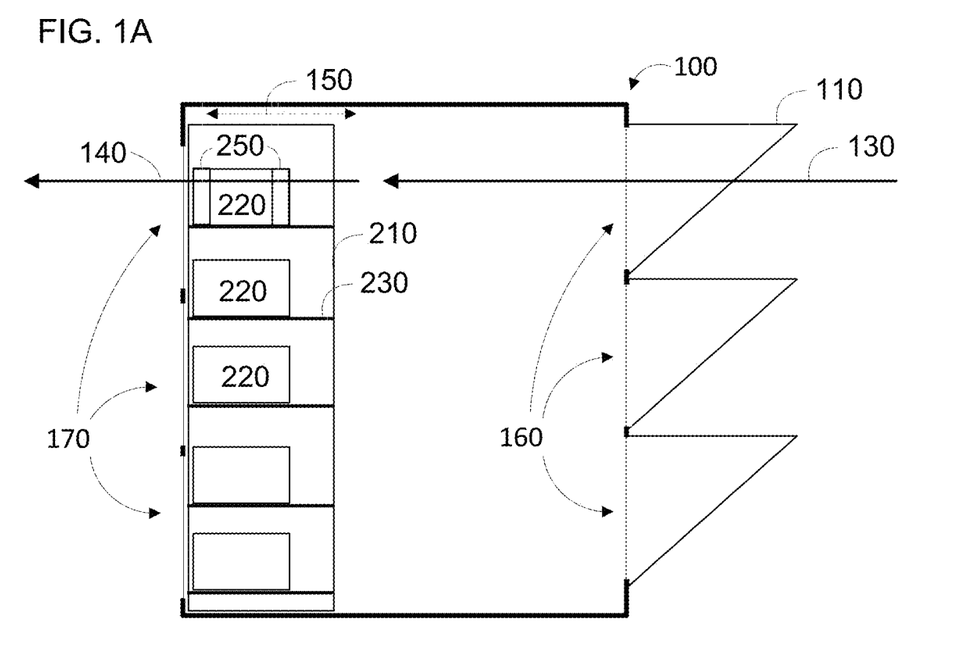
FIG. 1A is a side view of one example embodiment of a container-based data center for computing devices in a first configuration for normal temperatures.

Turning now to FIG. 1A, a side view of one example embodiment of a container-based data center for computing devices in a first configuration for normal temperatures is shown. In this example embodiment, the data center comprises one or more shipping containers 100 that each hold one or more racks 210 with a number of shelves 230 configured to support a number of computing devices 220. The computing devices in containers 100 are connected to power and network connections, as well as to a controller that is configured to manage the data center, e.g., providing status updates, configuring the computing devices, and distributing workloads to the computing devices. In this embodiment, container 100 has a set of air intake vents 160 on one side permitting cool outside air to enter the container 100, and a set of air exhaust vents 170 on the other side permitting hot air to be exhausted from the container 100. In some embodiments, air intake vents 160 may have shrouds 110 over them to prevent rain from entering the container 100. Shrouds 110 may also hold air filters to prevent debris from entering the container 100.

In the normal mode of operation illustrated, air is drawn into container 100 through air intake vents 160 as shown by arrow 130. The air is drawn into the container 100 by cooling fans 250 that are associated with, or are part of, each of computing devices 220. While some cooling fans 250 may be small in diameter, a large number of them in parallel can create a significant air flow. The cool ambient air drawn into container 100 is pulled through computing device 220 by cooling fans 250, extracting waste heat as it passes through the computing device 220 (e.g. by passing over heat sinks). The heated air is then exhausted out of the container 100 through air exhaust vents 170 as shown by arrow 140. In this embodiment, rack 210 is configured to slide horizontally as shown by arrow 150. This may for example the achieved by mounting rack 210 on sliding rails or rollers. As shown in this example, rack 210 is positioned immediately adjacent to the wall of container 100 against air exhaust vents 170 to permit computing devices 220 and cooling fans 250 to exhaust hot air out of container 100. Air exhaust vents 170 may be sealed to cooling fans 250 and computing devices 220 to prevent exhausted hot air from reentering container 100. However, complete sealing is not required, and some minor leakage of hot air from outside to inside the container and vice versa may occur (e.g., around access doors to the hot aisle, and around the edges of the computing devices 220 by the air exhaust vents 170) without significantly negatively impacting performance.

Figure 1B:
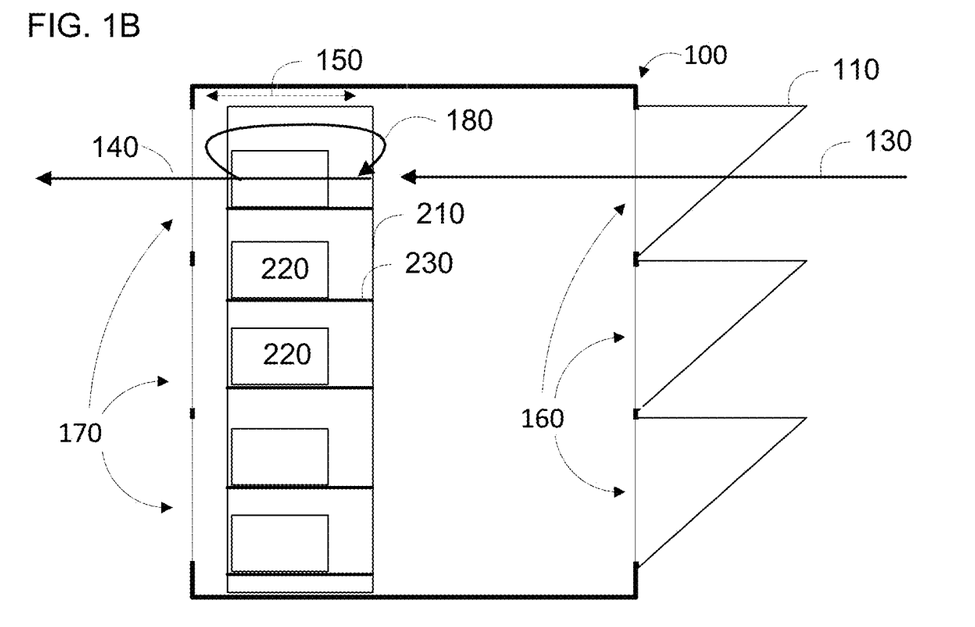
FIG. 1B is a side view of the example embodiment of FIG. 1A in a second configuration for low temperatures according to the teachings of the present disclosure.

Turning now to FIG. 1B, a side view of the example embodiment of FIG. 1A in a second configuration for low temperatures is shown. In this configuration, rack 210 has been moved away from the wall of container 100 and air exhaust vents 170. This prevents all of the hot air from being exhausted out of exhaust vents 170 and permits some of the hot air to be recirculated into the computing devices to 20 as indicated by arrow 180. In some embodiments air exhaust vents 170 may be partially blocked to further increase the amount of hot air that is recirculated within the container 100. The more hot air that is recirculated, the higher the temperature of the air entering the computing devices 220. This recirculation mixes the hot exhaust air from computing devices 220 with the cool ambient air drawn into container 100 to bring up the cool temperature to a more acceptable range. For example, some computing devices have a recommended operating temperature range or optimal operating temperature range for performance of 0° C.-40° C., so the predetermined threshold for changing the container from its normal operating mode to this low temperature mode may be 0° C. for more than 30 minutes, or a weather forecast indicating low temperatures at or below 0° C. for a significant period of time such as several hours. Some computing devices may perform better at the middle of their optimal operating temperature, than at the very edge of their recommended operating temperature range, so the temperature threshold may be higher (e.g., 10° C. in the example above).

In some embodiments, additional increases to the temperature of the air flowing through the computing devices may be achieved by further increasing the amount of hot air that is recirculated and mixed into the incoming cool ambient air in the container by configuring one or more of the computing devices 220 into a reverse airflow mode. In reverse airflow mode, the computing device draws air in from the side of the container with air exhaust vents 170 and exhausts air towards air intake vents 160. The reverse airflow mode may for example be implemented by reversing the direction of rotation of the fans in the one or more computing devices or by rotating the fans or computing devices by 180 degrees.

Figure 2:
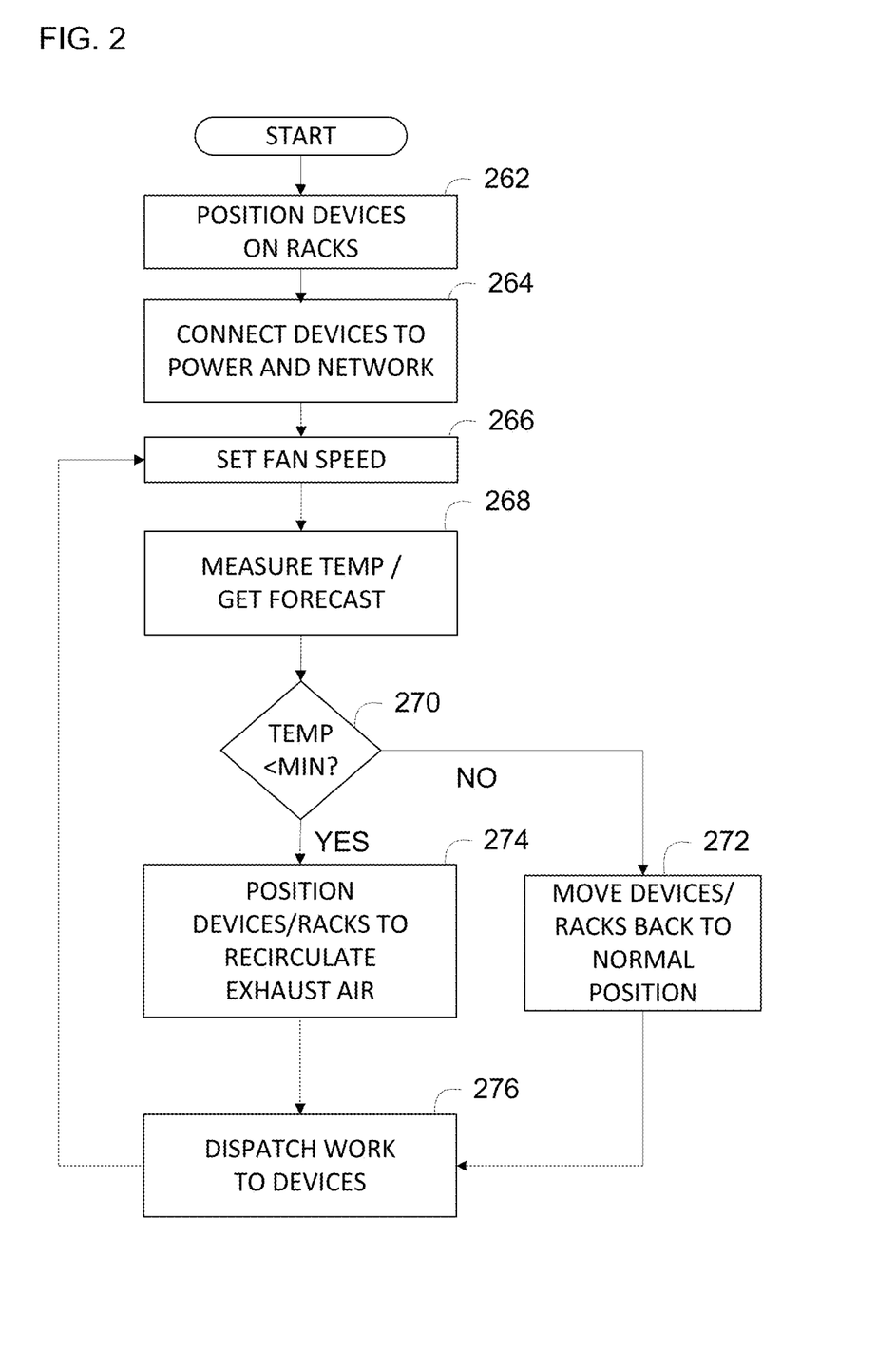
FIG. 2 is a flow chart of an example embodiment of a method for cooling computing devices in a data center according to the teachings of the present disclosure.

Turning now to FIG. 2, a flow chart of an example embodiment of a method for cooling computing devices in a data center according to the teachings of the present disclosure is shown. In this embodiment, the computing devices are positioned on one or more racks (step 262). The devices are connected to power and network connections (step 264). Cooling fan speeds for the computing devices are set (step 266), e.g., based on a pattern or predetermined default setting or device temperature. Temperature data is measured (step 268), e.g., by reading an environmental sensor or by gathering data from a networked weather forecast source. If the measured or predicted temperature is below a predetermined desired minimum threshold (step 270), e.g., for longer than a predetermined time period, the racks (or in some embodiments the computing devices themselves) may be moved away from the exhaust air vents to permit some of their exhausted hot air to recirculate (step 274). Exhaust vents may be adjusted if needed to achieve the desired amount of air recirculation. Work is dispatched to the computing devices (step 276), and fan speeds are adjusted as needed based on the computing devices temperature (step 266). Many computing devices have internal thermostats that indicate for example the processor or motherboard temperature to ensure safe operation. If the measured or predicted temperature is not below the predetermined minimum threshold (step 270), any racks or devices that have been moved may be reset back to their normal airflow mode position (step 272), and any adjusted exhaust vents may be reset or adjusted back to their normal position.

In some embodiments, a controller (which may be one of computing devices 220 or an external computing device outside the container but connected via a network connection) may be configured to control which mode each computing device (and container in the data center) is in based on measured temperatures or weather forecasts. The controller may include a data thermal management software application stored on computer-readable media that when executed responds to measured or forecasted temperatures below a predetermined threshold by generating support tickets for data center staff indicating which containers or devices should be configured in low temperature mode based on the measured or predicted temperature. In some embodiments, the controller may automate the reconfiguration process (e.g. with motorized platforms or sleds for devices, racks, or containers).

Figure 3A:
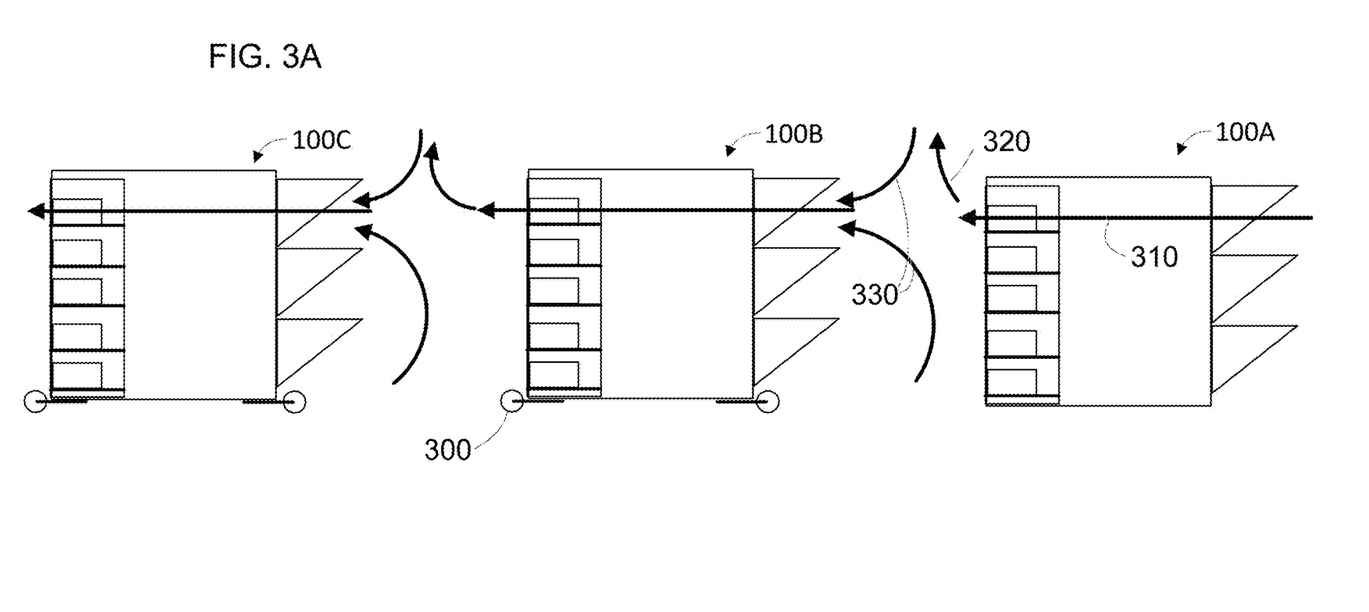
FIG. 3A is a side view of an example embodiment of a system for cooling computing devices in containers in a first configuration for normal temperatures according to the teachings of the present disclosure.

Turning now to FIG. 3A, a side view of an example embodiment of a system for cooling computing devices in containers in a first configuration for normal temperatures according to the teachings of the present disclosure is shown. In this configuration, containers 100A, 100B and 100C are spaced apart far enough that hot air exhausted from them escapes up into the atmosphere as indicated by arrow 320 (because the hot air is hotter than the ambient temperature, it naturally rises). With this spacing, the containers draw in cool ambient air as shown by arrows 310 and 330. Containers 100B and 100C may be configured with wheels 300 or other mechanisms to make moving them easier (e.g., sliding rails, motorized platforms, or motorized winches to pull containers on wheels or rails). In other embodiments, forklifts may be used to move the containers.

Figure 3B:
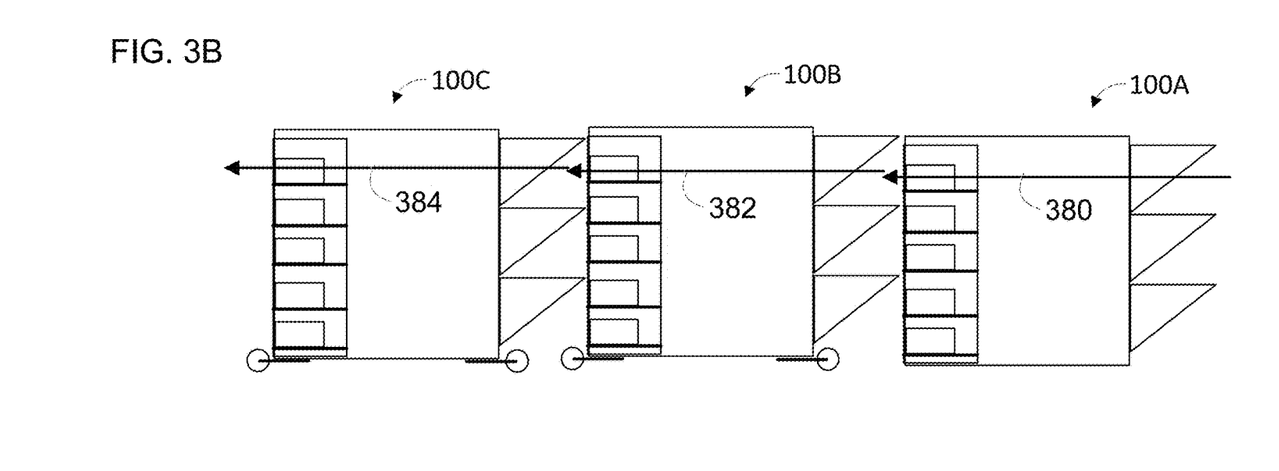
FIG. 3B is a side view of the example embodiment of FIG. 3A in a second configuration for low temperatures according to the teachings of the present disclosure.

Turning now to FIG. 3B, a side view of the example embodiment of FIG. 3A in a second configuration for low temperatures according to the teachings of the present disclosure is shown. In this configuration, the containers are positioned closer to one another such that containers 100B and 100C have their air intake vent close to the exhaust vent of another container. This permits at least some of the exhaust air to be captured, thereby raising the temperature of the air drawn into each subsequent container. Cool ambient air is drawn into container 100A and exhausted as shown by arrow 380, where at least a portion of it is then drawn into container 100B and exhausted as shown by arrow 382, where at least a portion of it is then drawn into container 100C and exhausted as shown by arrow 384. While three containers are shown in this example embodiment, longer chains are possible and contemplated.

Figure 4:
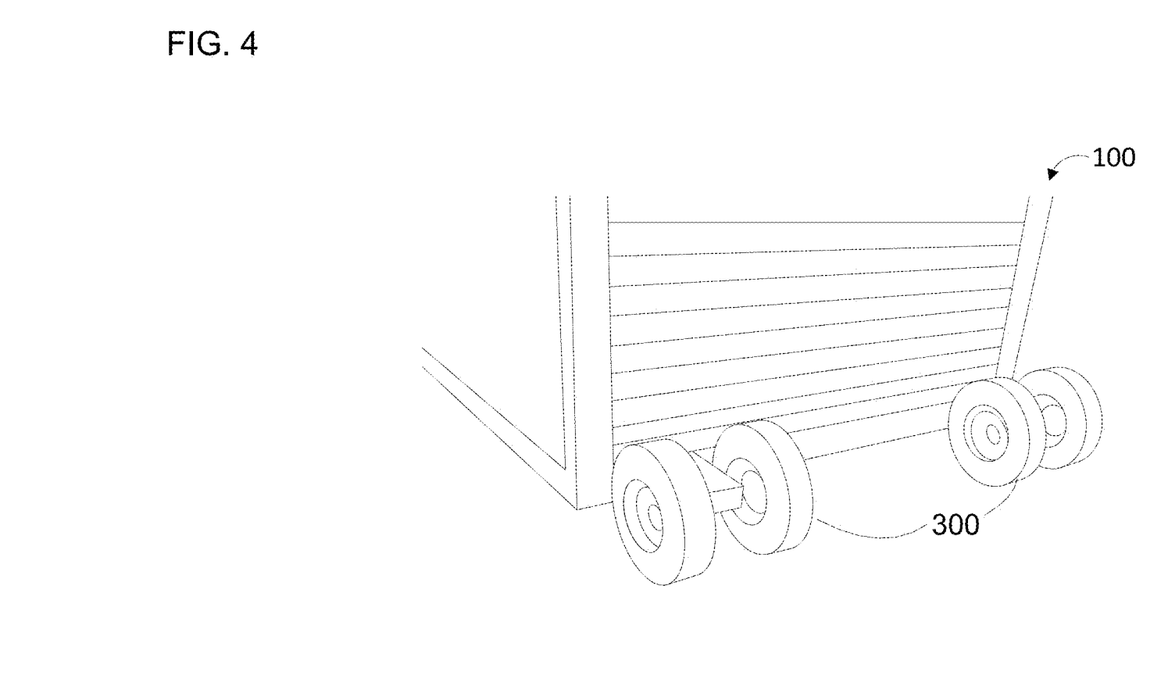
FIG. 4 is a perspective view of a portion of an exterior of one embodiment of container-based data center.

Turning now to FIG. 4, a perspective view of a portion of an exterior of one embodiment of container-based data center is shown. In this embodiment, wheels 300 are connected to container 100 to permit easier movement. Other mechanisms are possible and contemplated, including for example, motorized sleds, and mounting containers 100 on rails. In one embodiment, the containers are mounted with wheels on rails at a slight incline, and automated winches are used to either pull the containers closer together or space them farther apart.

Figure 5A:
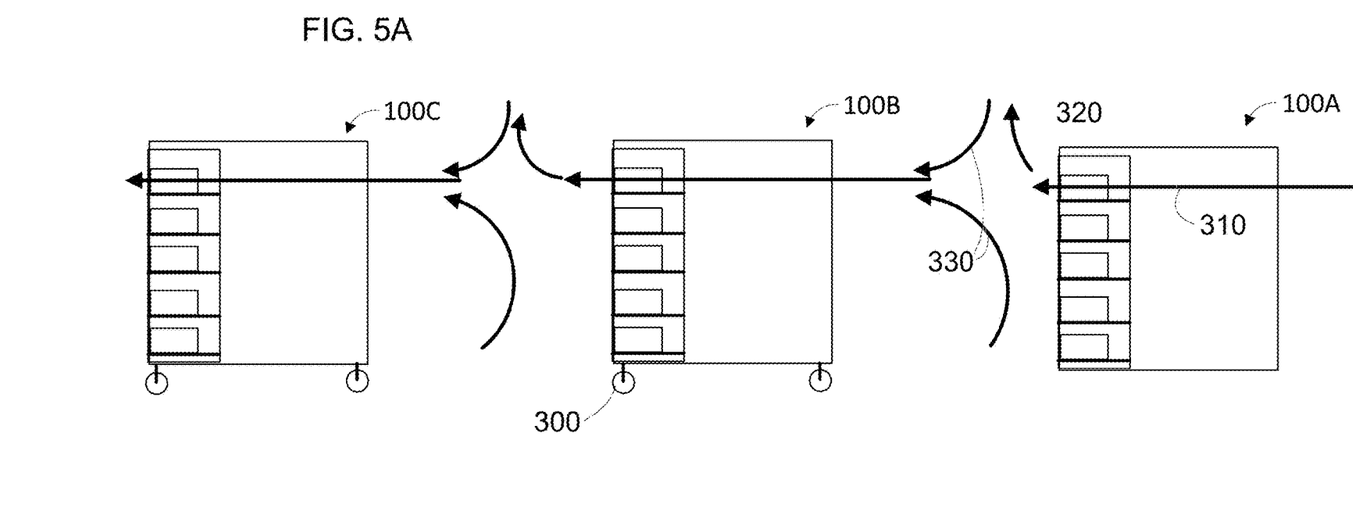
FIG. 5A is a side view of another example embodiment of a system for cooling computing devices in containers in a first configuration for normal temperatures according to the teachings of the present disclosure.

Turning now to FIG. 5A, a side view of another example embodiment of a system for cooling computing devices in containers in a first configuration for normal temperatures according to the teachings of the present disclosure is shown. In this example, containers 100A, 100B and 100C do not have shrouds on their air intake vents.

Figure 5B:
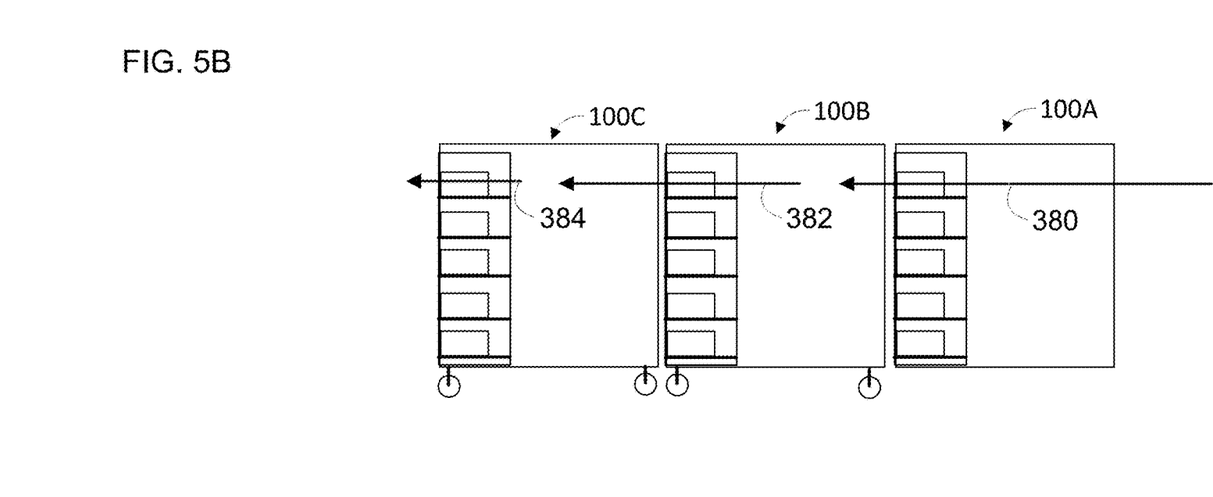
FIG. 5B is a side view of the example embodiment of FIG. 5A in a second configuration for low temperatures according to the teachings of the present disclosure.

Turning now to FIG. 5B, a side view of the example embodiment of FIG. 5A in a second configuration for low temperatures according to the teachings of the present disclosure is shown. Without shrouds, containers 100A, 100B and 100C may be positioned more closely when in their low temperature mode configuration. This may permit more exhaust air to be recaptured. For example, cool ambient air may be drawn into container 100A and exhausted as shown by arrow 380, where most or all of it is then drawn into container 100B and exhausted as shown by arrow 382, where most or all it is then drawn into container 100C and exhausted as shown by arrow 384. In some embodiments, the distance between the containers may be adjusted based on the measured or predicted external air temperature, or based on reported computing device temperatures.

Figure 6A:
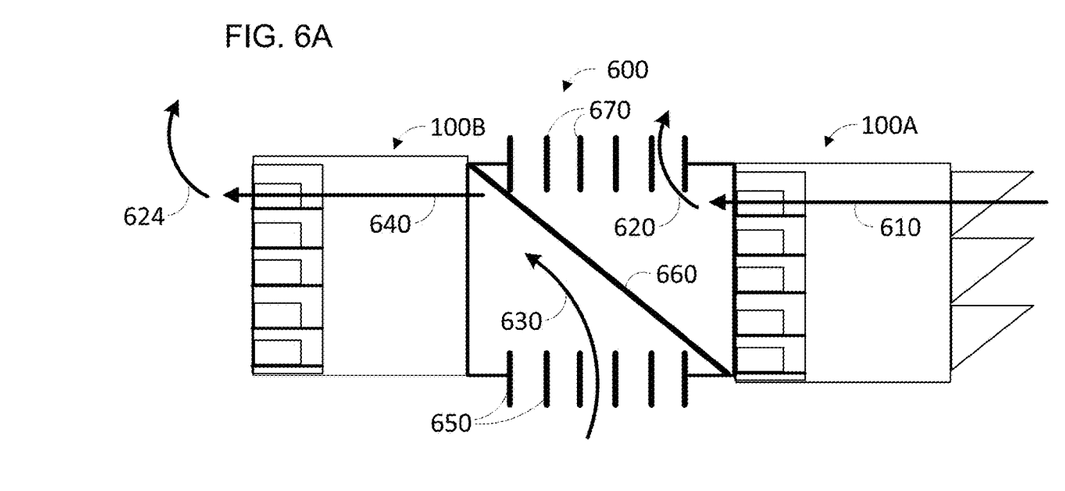
FIG. 6A is a side view of yet another example embodiment of a system for cooling computing devices in containers in a first configuration for normal temperatures according to the teachings of the present disclosure.

Turning now to FIG. 6A, a side view of yet another example embodiment of a system for cooling computing devices in containers in a first configuration for normal temperatures according to the teachings of the present disclosure is shown. In this embodiment, containers 100A and 100B are not configured to move to switch modes. Instead, a connector 600 with a set of adjustable valves (e.g. motorized, network-controllable louvers) 650, 660, and 670 is positioned between them. In this configuration, valves 650 and 670 are open and valves 660 are closed. Cool ambient air is drawn into each container via the container's air intake vents as shown by arrows 610 and 630, and hot air is exhausted from the containers as shown by arrows 620 and 624.

Figure 6B:
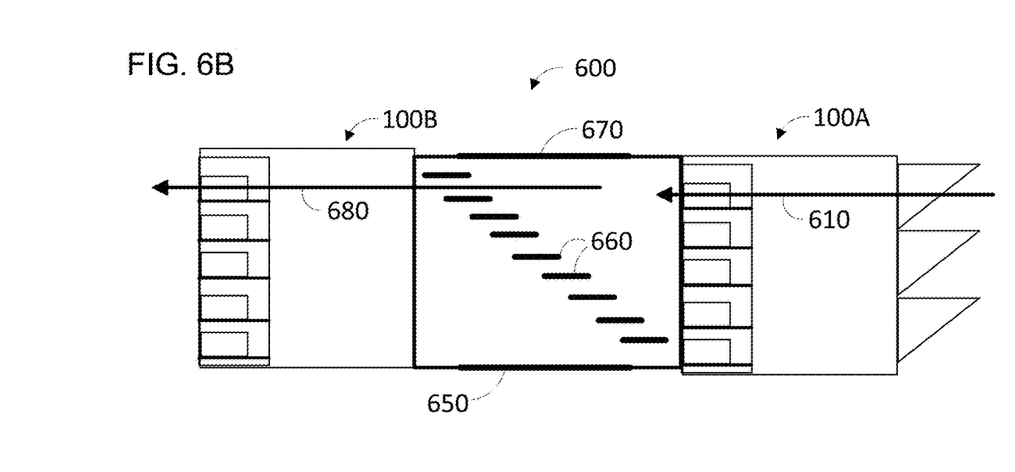
FIG. 6B is a side view of the example embodiment of FIG. 6A in a second configuration for low temperatures according to the teachings of the present disclosure.

Turning now to FIG. 6B, a side view of the example embodiment of FIG. 6A in a second configuration for low temperatures according to the teachings of the present disclosure is shown. In this configuration, valves 650 and 670 are closed, and valves 660 are open. This permits hot exhaust air from container 100A to pass through connector 600 and be drawn into container 100B as shown by arrows 610 and 680. While valves 650 and 670 are shown as completely closed and valve 660 is shown as completely open, in some embodiments the valves may be partially opened or closed based for example on the ambient temperature and the desired operating temperature for the particular computing devices in each container. In some embodiments connector 600 may itself be constructed of a container similar to containers 100A and 100B, but with motorized valves inside instead of or in addition to racks and computing devices. While not shown in the figures, sensors readable by the controller may be positioned within the containers 100A and 100B, within connector 600, and outside to measure ambient and internal mixed temperatures. Based on these measured temperatures (or predicted temperatures), the controller may dynamically adjust the settings of valves 650, 660, and 670.

Figure 7:
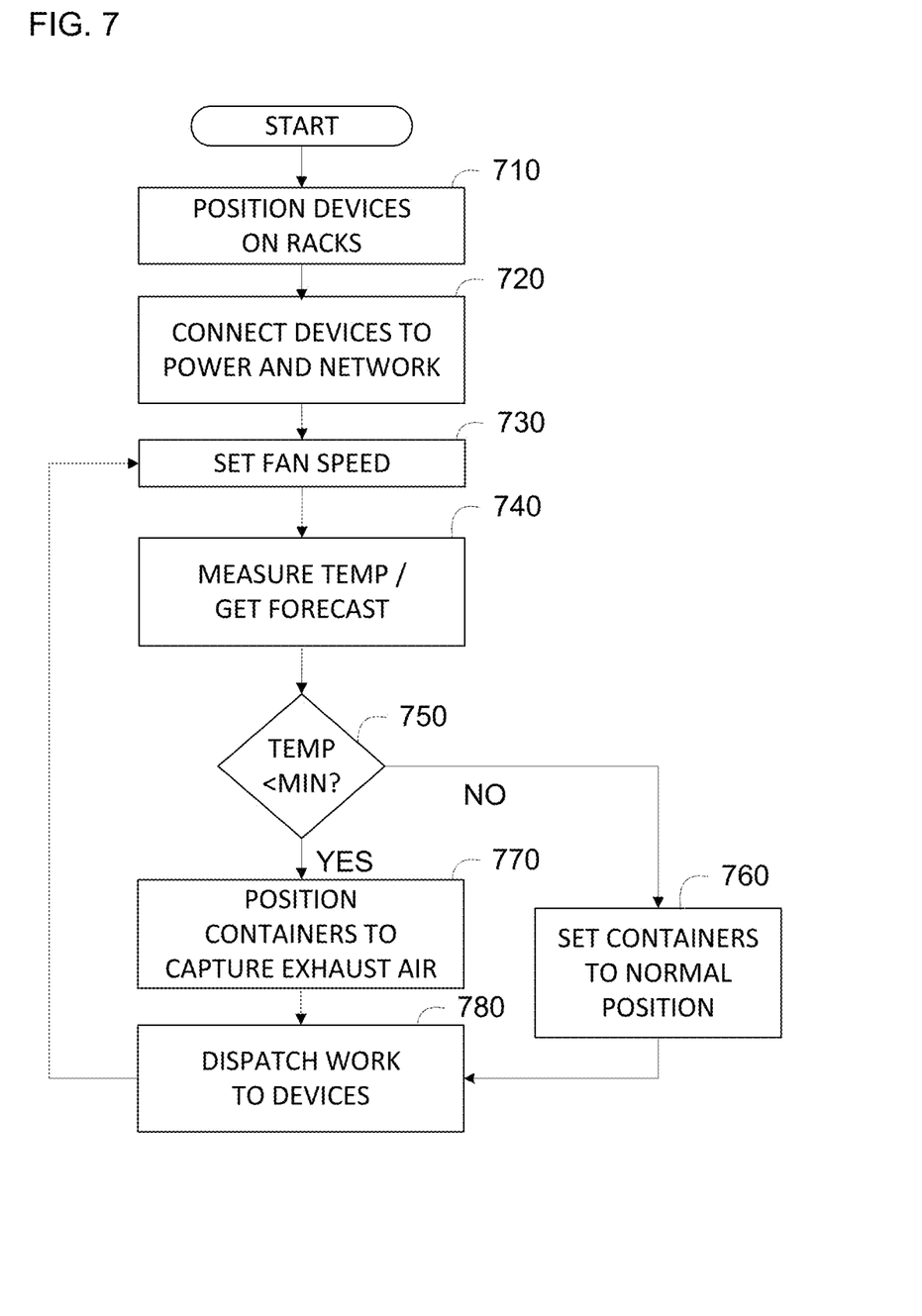
FIG. 7 is a flow chart of another example embodiment of a method for cooling computing devices in a data center according to the teachings of the present disclosure.

Turning now to FIG. 7, a flow chart of another example embodiment of a method for cooling computing devices in a data center according to the teachings of the present disclosure is shown. In this embodiment, the computing devices are positioned on one or more racks (step 710). The devices are connected to power and network connections (step 720). Cooling fan speeds for the computing devices are set (step 730), e.g., based on a pattern or predetermined default setting or device temperature. Temperature data is measured (step 740), e.g., by reading an environmental sensor or by gathering data from a networked weather forecast source. If the measured or predicted temperature is below a predetermined desired minimum threshold (step 750), e.g., for longer than a predetermined time period, the containers may be positioned to permit at least some of the exhausted hot air from one container to be captured by the other container or containers (step 770). For example, this may entail moving the containers toward each other so that one container's exhaust air vents are close enough to the other container's air intake vents to permit some of the exhausted hot air to recirculate, or it may entail setting valves in a connector between them. Work is dispatched to the computing devices (step 780), and fan speeds are adjusted as needed based on the computing devices temperature (step 730). If the measured or predicted temperature is not below the predetermined minimum threshold (step 750), the containers or connectors may be reset back to their normal airflow mode configuration/position (step 760).

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for managing airflow for a plurality of computing devices, the method comprising:

positioning the plurality of computing devices on a plurality of racks in a plurality of containers each having an intake side vent and an exhaust side vent, wherein each of the computing devices comprises a cooling fan configured to generate an airflow through the computing device and exhaust hot air out the exhaust side vent;

configuring each of the plurality of containers in a first mode, wherein in the first mode cool air is drawn into each of the containers from the intake side vent and hot air is exhausted from a second side;

reading temperature data; and in response to the temperature data being below a predetermined threshold, temporarily reconfiguring a first selected one of the plurality of containers in a second mode to draw hot air exhausted by a second selected one of the plurality of containers into the first selected container's intake side vent;

wherein said temporarily reconfiguring the first selected container comprises temporarily moving the first selected container adjacent to the second selected container so that the first selected container's intake side vent is adjacent to the second selected container's exhaust side vent.

2. The method of claim 1, wherein said temporarily reconfiguring the first selected container comprises operating the cooling fans of the plurality of computing devices in a reverse direction.

3. The method of claim 1, further comprising in response to the temperature data being below a predetermined threshold, temporarily reconfiguring a third selected one of the plurality of containers to draw hot air exhausted by the first selected container into the third selected container's intake side vent.

4. The method of claim 3, wherein said temporarily reconfiguring the third selected container comprises temporarily moving the third selected container adjacent to the first selected container so that the third selected container's intake side vent is adjacent to the first selected container's exhaust side vent.

5. The method of claim 1, wherein said temporarily reconfiguring the first selected container comprises connecting the first selected container's intake side vent to the second selected container's exhaust side vent until the temperature data for the first selected container is above a minimum threshold.

6. The method of claim 4, wherein said temporarily reconfiguring the third selected container comprises connecting the third selected container's intake side vent to the first selected container's exhaust side vent.

7. The method of claim 2, wherein the first selected container is on wheels to permit easier movement.

8. The method of claim 1, wherein the temperature data comprises weather forecast data.

9. The method of claim 1, further comprising:
increasing speed of the cooling fans in the first selected container in response to said configuring; and
decreasing speed of the cooling fans in the first selected container in response to said reconfiguring.

10. The method of claim 1, wherein said temporarily reconfiguring the first selected container comprises temporarily connecting the first selected container's intake side vent to the second selected container's exhaust side vent.

11. A system for managing temperatures in a data center, the system comprising:
a plurality of containers each having an intake side vent and an exhaust side vent;
a plurality of racks each positioned inside one of the plurality of containers and configured to hold a plurality of computing devices, wherein each computing device comprises a cooling fan configured to generate an airflow through the computing device and exhaust hot air out the exhaust side vent; and
a controller configured to:
(i) configure each of the plurality of containers in a first mode, wherein in the first mode cool air is drawn into each of the containers from the intake side vents and hot air is exhausted from a second side,
(ii) read temperature data, and
(iii) in response to the temperature data being below a predetermined threshold, cause a temporary reconfiguration of a first selected one of the plurality of containers in a second mode to draw in hot air exhausted by one or more of the plurality of computing devices via temporary movement of the plurality of containers or temporary direction of air.

12. The system of claim 11, wherein the first selected container's intake side vent is connected to a second selected container's exhaust side vent in the second mode.

13. The system of claim 11, wherein the second mode comprises moving the computing devices in the first selected container away from the exhaust side vent of the first selected container to permit the hot air to recirculate within the first selected container.

14. The system of claim 12, wherein the temperature data comprises weather forecast data and ambient temperatures measured by sensors connected to the controller.

15. The system of claim 12, wherein the controller is further configured to temporarily move the first selected container adjacent to a second selected container so that the first selected container's intake side vent is adjacent to the second selected container's exhaust side vent until the temperature data is above a minimum threshold.

16. The system of claim 15, wherein the controller is further configured to temporarily reconfigure a third selected one of the plurality of containers to draw hot air exhausted by the first selected container into the third selected container's intake side vent.

17. The system of claim 15, further comprising one or more adjustable air deflectors configured to temporarily direct hot air exhausted from the second selected container toward the first selected container's intake side vent.

18. A non-transitory, computer-readable storage medium storing instructions executable by a processor of a computational device, which when executed cause the computational device to:
configure each of a plurality of containers in a first mode, wherein each container comprises a plurality of computing devices on a plurality of racks each having an intake side vent and an exhaust side vent, wherein each of the computing devices comprises a cooling fan configured to generate an airflow through the computing device and exhaust hot air out the exhaust side vent, wherein in the first mode cool air is drawn into each of the containers from the intake side vent and hot air is exhausted from a second side;
read temperature data; and
in response to the temperature data being below a predetermined threshold, temporarily reconfigure a first selected one of the plurality of containers in a second mode to draw hot air exhausted by a second selected one of the plurality of containers into the first selected container's intake side vent by temporarily moving the second selected one of the plurality of containers substantially adjacent to the first selected one of the plurality of containers until the temperature data of the first selected container is above a minimum threshold.

19. The non-transitory, computer-readable storage medium of claim 18, which when executed further causes the computational device to, in response to the temperature data being below the predetermined threshold, temporarily reconfigure a third selected one of the plurality of containers to draw hot air exhausted by the first selected container into the third selected container's intake side vent.

20. The non-transitory, computer-readable storage medium of claim 18, wherein the temperature data comprises weather forecast data and ambient temperature data.

* * * * *